US011112813B2

(12) United States Patent
Wei et al.

(10) Patent No.: US 11,112,813 B2
(45) Date of Patent: Sep. 7, 2021

(54) DISTRIBUTED LOW-DROPOUT VOLTAGE REGULATOR (LDO) WITH UNIFORM POWER DELIVERY

(71) Applicant: Shenzhen Goodix Technology Co., Ltd., Shenzhen (CN)

(72) Inventors: Dazhi Wei, Austin, TX (US); Xiaodong Wang, Austin, TX (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/699,076

(22) Filed: Nov. 28, 2019

(65) Prior Publication Data

US 2021/0165435 A1 Jun. 3, 2021

(51) Int. Cl.
*G05F 1/575* (2006.01)
*G11C 5/14* (2006.01)
*G11C 11/4074* (2006.01)
*G11C 16/30* (2006.01)

(52) U.S. Cl.
CPC .................................... *G05F 1/575* (2013.01)

(58) Field of Classification Search
CPC ....................................................... H03K 1/575
See application file for complete search history.

(56) References Cited

U.S. PATENT DOCUMENTS 6,674,270 B2 * 1/2004 Sakamoto ............... G05F 1/577 307/44
6,683,767 B2 * 1/2004 Ito ........................... H01L 23/50 257/E23.079
7,161,339 B2 * 1/2007 Chen ....................... G05F 1/575 323/274
7,788,515 B2 * 8/2010 Wong ........................ G06F 1/26 713/330
8,160,654 B2 * 4/2012 Onishi .................... H02J 50/90 455/572
8,294,442 B2 * 10/2012 Zhu ......................... G05F 1/575 323/281
8,305,066 B2 * 11/2012 Lin .......................... G05F 1/575 323/285

(Continued)

FOREIGN PATENT DOCUMENTS

CN 102681581 A 9/2012
CN 202838077 U 3/2013

(Continued)

*Primary Examiner* — Kenneth B Wells
(74) *Attorney, Agent, or Firm* — Kilpatrick Townsend & Stockton LLP

(57) ABSTRACT

An integrated circuit includes a plurality of voltage regulators. A given voltage regulator of the plurality of voltage regulators includes a differential amplifier and an output transistor. The differential amplifier and the output transistor are coupled at a gate node of the output transistor. The voltage regulator provides a regulated output voltage at an output node of the output transistor. The integrated circuit includes a common gate line, which is coupled to the gate node of the output transistor in each of the plurality of voltage regulators. The integrated circuit also includes a common power line, which is coupled to the output node of the output transistor in each of the plurality of voltage regulators. The common power line provides operational power to one or more circuit blocks in the integrated circuit.

18 Claims, 8 Drawing Sheets

(56) References Cited

U.S. PATENT DOCUMENTS

| | | | | |
|---|---|---|---|---|
| 8,471,538 | B2 * | 6/2013 | Pancholi | G05F 1/575 323/274 |
| 8,812,879 | B2 * | 8/2014 | Wen | G06F 1/3203 713/300 |
| 9,195,247 | B2 * | 11/2015 | Saito | H02M 3/1588 |
| 9,983,604 | B2 * | 5/2018 | Lee | G09G 3/3696 |
| 10,444,780 | B1 * | 10/2019 | Cheng | H03F 3/45179 |
| 10,571,945 | B2 * | 2/2020 | Pishdad | G06F 1/3203 |
| 10,591,938 | B1 * | 3/2020 | Golara | H03F 3/45183 |
| 2013/0257542 | A1 | 10/2013 | Kao | |
| 2015/0130292 | A1 | 5/2015 | Yeon et al. | |
| 2019/0123648 | A1 | 4/2019 | Huang et al. | |
| 2019/0392871 | A1 * | 12/2019 | Tang | G05F 1/563 |

FOREIGN PATENT DOCUMENTS

| | | | |
|---|---|---|---|
| CN | 103713682 | A | 4/2014 |
| CN | 104536506 | A | 4/2015 |
| CN | 106444947 | A | 2/2017 |
| CN | 107402591 | A | 11/2017 |
| CN | 110011536 | A | 7/2019 |
| CN | 110221643 | A | 9/2019 |

* cited by examiner

DISTRIBUTED LOW-DROPOUT VOLTAGE REGULATOR (LDO) WITH UNIFORM POWER DELIVERY

CROSS-REFERENCES TO RELATED APPLICATIONS

This application is related to U.S. patent application Ser. No. 16/699,080, entitled "VOLTAGE REGULATOR CIRCUIT WITH HIGH POWER SUPPLY REJECTION RATIO," filed on the same day, the content of which is incorporated by reference herein.

BACKGROUND OF THE INVENTION

Voltage regulators, in particular linear voltage regulators, are devices that are used to maintain a steady voltage. Because of the ability to provide steady voltages, voltage regulators have broad applicability. For example, voltage regulators may be utilized with analog-to-digital converters (ADC), application specific integrated circuits (ASICs), field programmable gate arrays (FPGAs), image sensors, and other high performance/high power products. The voltage regulators may provide clean (e.g., steady) output voltage to one or more components of these high performance/high power products even in instances where input voltage into the voltage regulator is close to the output voltage.

However, while the use of voltage regulators, especially low-dropout voltage regulators (LDOs) has increased, so has the need for power in system on chips (SoCs). In SoCs, a power grid may be utilized to power one or more components of the SoC. However, in current SoCs, configurations for power distribution, via a power grid, may result in non-uniform heat and/or power distribution within the SoC. This non-uniformity may lead to various issues such as performance depreciation of one or more components within the SoC. Therefore, there is a need for a chip design that may be utilized with a power grid in order to achieve uniform heat and power distribution within an SoC.

BRIEF SUMMARY OF THE INVENTION

Embodiments described herein generally relate to a distributed voltage regulators structure that may achieve uniform power and heat distribution. Although this disclosure may specifically recite LDO voltage regulators, it is within the scope of the disclosure to utilize any type of suitable voltage regulator such as switching regulators. An LDO structure may be provided where each output of an LDO in the LDO structure may feed into a common power line, or a central power grid. This common power line may be utilized to power one or more circuit components within or external to a chip architecture. A gate node of the output transistor in the LDO can also be coupled together to a common gate line. This configuration can further improve the uniform distribution of power supply voltage over a large integrated circuit chip. Further, this configuration can be implemented without adversely affecting the loop stability of the circuit.

According to some embodiments of the present invention, an integrated circuit includes a plurality of circuit blocks and a plurality of voltage regulators spatially distributed over the integrated circuit. Each voltage regulator is associated with a respective circuit block of the plurality of circuit blocks. A given voltage regulator of the plurality of voltage regulators includes a differential amplifier and an output transistor. The differential amplifier is configured to amplify a differential between a reference voltage and a regulated output voltage. An output of the differential amplifier is coupled to a gate node of the output transistor, and the regulated output voltage is derived at an output node of the output transistor. The integrated circuit also includes a common gate line, which is coupled to the gate node of the output transistor in each of the plurality of voltage regulators. The integrated circuit also includes a common power line, which is coupled to the output node of the output transistor in each of the plurality of voltage regulators, the common power line providing operational power to the plurality of circuit blocks in the integrated circuit.

In some embodiments of the above integrated circuit, each of the plurality of voltage regulators includes a low dropout (LDO) voltage regulator.

In some embodiments, the output transistor of the given voltage regulator includes a P-channel MOS transistor, and the output node is at a drain node of the P-channel MOS transistor.

In some embodiments, the output transistor of the given voltage regulator comprises an N-channel MOS transistor, and the output node is at a drain node of the N-channel MOS transistor.

In some embodiments, the output transistor of the given voltage regulator comprises an N-channel MOS transistor, and the output node is at a source node of the N-channel MOS transistor.

According to some embodiments of the present invention, an integrated circuit, includes a plurality of voltage regulators, a given voltage regulator of the plurality of voltage regulators includes a differential amplifier and an output transistor. The differential amplifier and the output transistor are coupled at a gate node of the output transistor to provide a regulated output voltage at an output node of the output transistor. The integrated circuit also includes a common gate line, which is coupled to the gate node of the output transistor in each of the plurality of voltage regulators. The integrated circuit further includes a common power line, which is coupled to the output node of the output transistor in each of the plurality of voltage regulators. The common power line provides an operational power to one or more circuit blocks in the integrated circuit.

In some embodiments of the above integrated circuit each of the plurality of voltage regulators is a linear regulator.

In some embodiments, each of the plurality of voltage regulators includes a low dropout (LDO) regulator.

In some embodiments, the output transistor of the given voltage regulator is a power transistor.

In some embodiments, the output transistor of the given voltage regulator includes a P-channel MOS transistor, and the output node is at a drain node of the P-channel MOS transistor.

In some embodiments, the output transistor of the given voltage regulator includes an N-channel MOS transistor, and the output node is at a drain node of the N-channel MOS transistor.

In some embodiments, the output transistor of the given voltage regulator includes an N-channel MOS transistor, and the output node is at a source node of the N-channel MOS transistor.

In some embodiments, the Vg nodes of all LDOs are shorted together and being shielded with Vdd.

In some embodiments, the gate node of the output transistor in the given voltage regulator determines a dominant pole of the voltage regulator.

In some embodiments, the plurality of voltage regulators are distributed symmetrically over the integrated circuit.

According to some embodiments of the present invention, a method includes disposing a plurality of voltage regulators over an integrated circuit. A given voltage regulator of the plurality of voltage regulators includes a differential amplifier and an output transistor. The differential amplifier and the output transistor are coupled at a gate node of the output transistor and provide a regulated output voltage at an output node of the output transistor. The method includes coupling a common gate line to the gate node of the output transistor in each of the plurality of voltage regulators. The method also includes coupling a common power line to the output node of the output transistor in each of the plurality of voltage regulators.

In some embodiments, the method can also include providing operational power from the common power line to one or more circuit blocks in the integrated circuit.

In some embodiments, each of the plurality of voltage regulators includes a low dropout (LDO) voltage regulator.

In some embodiments, the output transistor of the given voltage regulator includes a P-channel MOS transistor, and the output node is at a drain node of the P-channel MOS transistor.

In some embodiments, the output transistor of the given voltage regulator includes an N-channel MOS transistor, and the output node is at a drain node of the N-channel MOS transistor.

In some embodiments, the output transistor of the given voltage regulator includes an N-channel MOS transistor, and the output node is at a source node of the N-channel MOS transistor.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components. If only the first reference label is used in the specification, the description can be applicable to any one of the similar components having the same first reference label irrespective of the second reference label.

DETAILED DESCRIPTION OF THE INVENTION

In the following description, for the purposes of explanation, specific details are set forth in order to provide a thorough understanding of certain inventive embodiments. However, it will be apparent that various embodiments may be practiced without these specific details. The figures and description are not intended to be restrictive. The word "exemplary" is used herein to mean "serving as an example, instance, or illustration". Any embodiment or design described herein as "exemplary" is not necessarily to be construed as preferred or advantageous over other embodiments or designs.

Although this disclosure may reference MOSFET based LDOs it is within the scope of this disclosure to apply the techniques herein to voltage regulators of different configurations, including, Bipolar Junction Transistor (BJT) LDOs, BJT switch transistors, and the like.

Figure 1B:
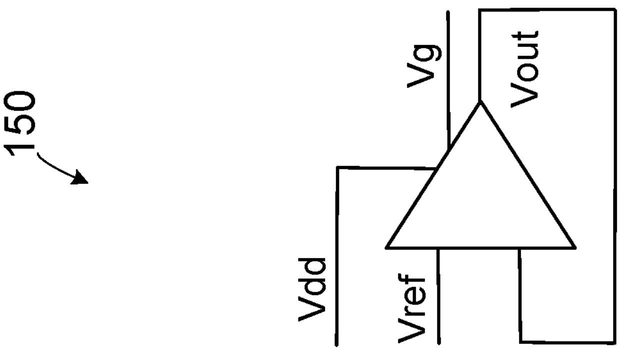
FIG. 1B is a simplified schematic diagram used as a symbol representing a linear voltage regulator according to some embodiments of the present invention.
Figure 1A:
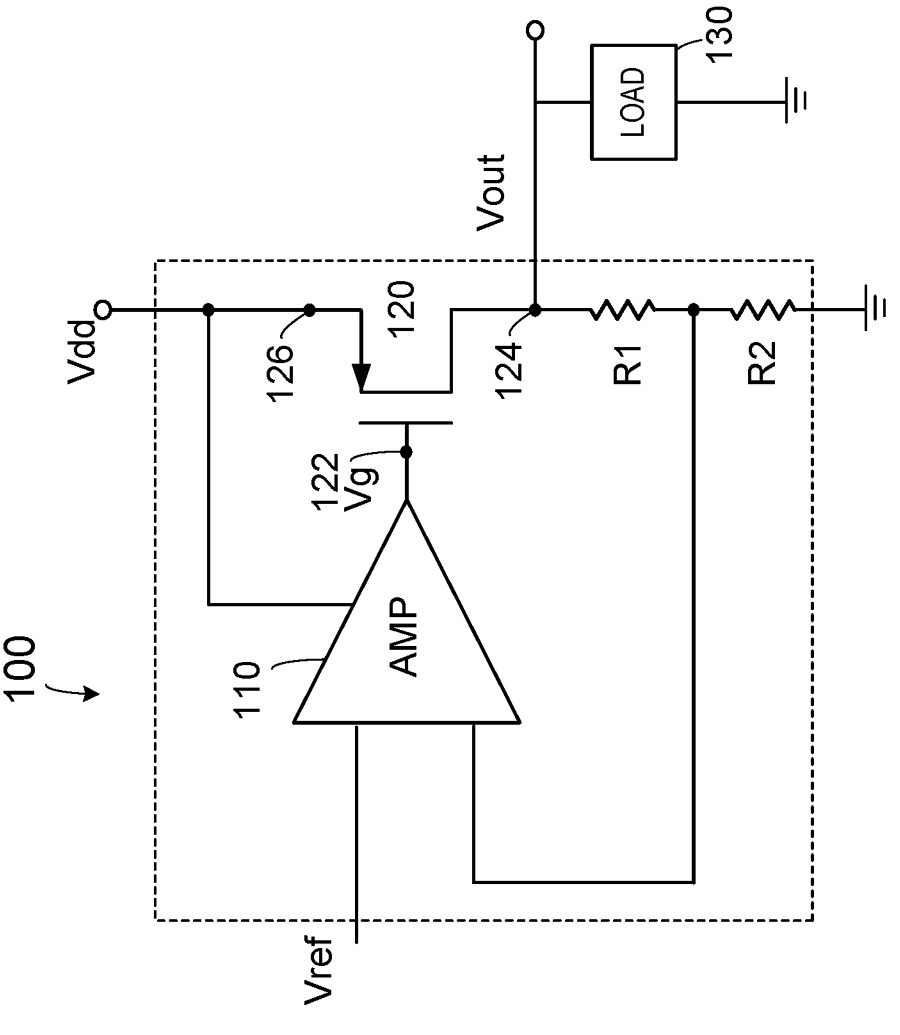
FIG. 1A is a simplified schematic diagram illustrating an example of a low-dropout voltage regulator (LDO) according to some embodiments of the present invention.

FIG. 1A is a simplified schematic diagram illustrating an example of a low-dropout voltage regulator (LDO) according to some embodiments of the present invention. A low-dropout or LDO regulator is a DC linear voltage regulator which can regulate the output voltage. The main components of the LDO regulator can include a differential amplifier and an output transistor. FIG. 1A illustrates an example of LDO 100, in which the differential amplifier 110 can be an error amplifier, and the output transistor 120 can be a power FET (field effect transistor). Differential amplifier 110 is configured to amplify a differential between a reference voltage Vref and a regulated output voltage Vout sampled by a voltage divider formed by resistors R1 and R2. An output of the differential amplifier 110 is coupled to a gate node 122 of output transistor 120. The regulated output voltage Vout is derived at an output node 124 of output transistor 120. The gate voltage at gate node 122 is designated as Vg in FIG. 1A. FIG. 1A also shows a power supply Vdd that provides operational power to LDO 100. A load device 130 receives power provided by LDO 100.

The low-dropout voltage regulator (LDO) illustrated in FIG. 1A is an example of a linear regulator in an electronic circuit used to maintain a steady voltage. As illustrated in FIG. 1A, one input of the differential amplifier 110 monitors the output Vout, and the second input to the differential amplifier 110 receives the control signal, which in this case is reference voltage Vref. If the output voltage rises too high relative to the reference voltage, the drive to the power FET changes to maintain a constant output voltage.

LDO 100 in FIG. 1A has an open drain topology. Output transistor 120 is P-channel MOS (Metal Oxide Semiconductor) transistor, also designated as a PMOS transistor, with a source node 126 coupled to power supply Vdd, and a drain node 124 serving as an output node, to which load device is attached. In this topology, the output transistor 120 may be easily driven into saturation with the voltages available to the regulator. This allows the voltage drop from the unregulated voltage Vdd to the regulated voltage Vout to be as low as the saturation voltage across the transistor.

FIG. 1B is a simplified schematic diagram used as a symbol representing a linear voltage regulator according to some embodiments of the present invention. In various embodiments, a linear regulator can include a differential amplifier and an output transistor, the differential amplifier and the output transistor coupled at a gate node of the output transistor and providing a regulated output voltage at an output node of the output transistor. As shown in FIG. 1B, linear regulator 150 includes a power supply Vdd, a reference voltage signal Vref, an output voltage Vout, and a gate voltage Vg at a gate node of an output transistor in the linear regulator. An example of a linear regulator is described above in FIG. 1A, which illustrates a low drop off regulator LDO 100. It is understood, however, linear regulator 150 in FIG. 1B can represent any linear regulator in a circuit topology other than that of an LDO.

Figure 2:
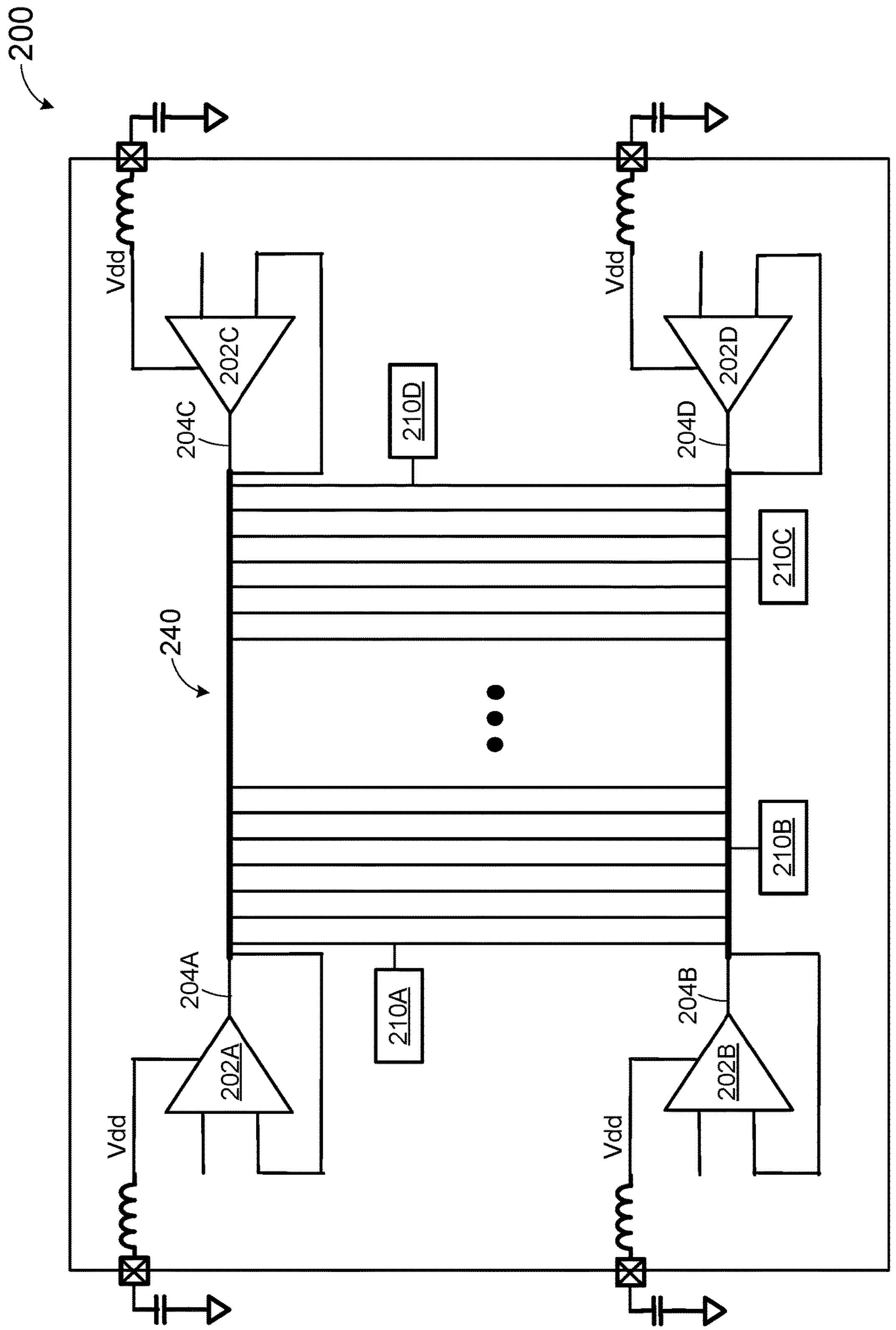
FIG. 2 is a simplified schematic diagram illustrating an integrated circuit chip having a distributed LDO structure according to some embodiments of the present invention.

FIG. 2 is a simplified schematic diagram illustrating an integrated circuit chip having a distributed LDO structure according to some embodiments of the present invention. For more uniform power distribution and heat dissipation on large chip, a multi-LDO structure can be used as illustrated FIG. 2. As shown in FIG. 2, an integrated circuit 200 includes a plurality of circuit blocks 210A, 210B, 210C, and 210D, . . . , etc. Integrated circuit 200 also includes a plurality of voltage regulators 202A, 202B, 202C, and 202D, . . . , etc., spatially distributed over the integrated circuit. Each one of voltage regulator 202A, 202B, 202C, and 202D, . . . etc., is associated with a respective circuit block of the plurality of circuit blocks 210A, 210B, 210C, and 210D. "As used herein, a circuit block refers to a portion of the integrated circuit 200 that is coupled to a regulator to receive power supply."

In some embodiments, voltage regulators 202A, 202B, 202C, and 202D can be low dropout regulators (LDOs). Similar to LDO 100 and LDO 150, each of the LDOs in FIG. 2 can have a differential amplifier and an output transistor. The differential amplifier is configured to amplify a differential between a reference voltage and a regulated output voltage. An output of the differential amplifier is coupled to a gate node of the output transistor. The regulated output voltage is derived at an output node of the output transistor.

Integrated circuit 200 also has a common power line 240, which is coupled to the output node of the output transistor in each of the plurality of voltage regulators. As shown in FIG. 2, common power line 240 is coupled to output node 204A for voltage regulator 202A, output node 204B for voltage regulator 202B, output node 204C for voltage regulator 202C, and output node 204D for voltage regulator 202D. The common power line provides operational power to the plurality of circuit blocks in the integrated circuit. It can be seen in FIG. 2 that circuit blocks 210A-210D are coupled to common power line 240 to receive operational power.

As shown in FIG. 2, the output nodes 204A, 204B, 204C, and 204D are shorted together by the common power line 240. Common power line 240 can include multiple line segments distributed over the integrated circuit chip, and can be referred to as a power grid. The common power line can facilitate uniform distribution of operating power to circuit blocks disposed over the integrated circuit chip.

Figure 3:
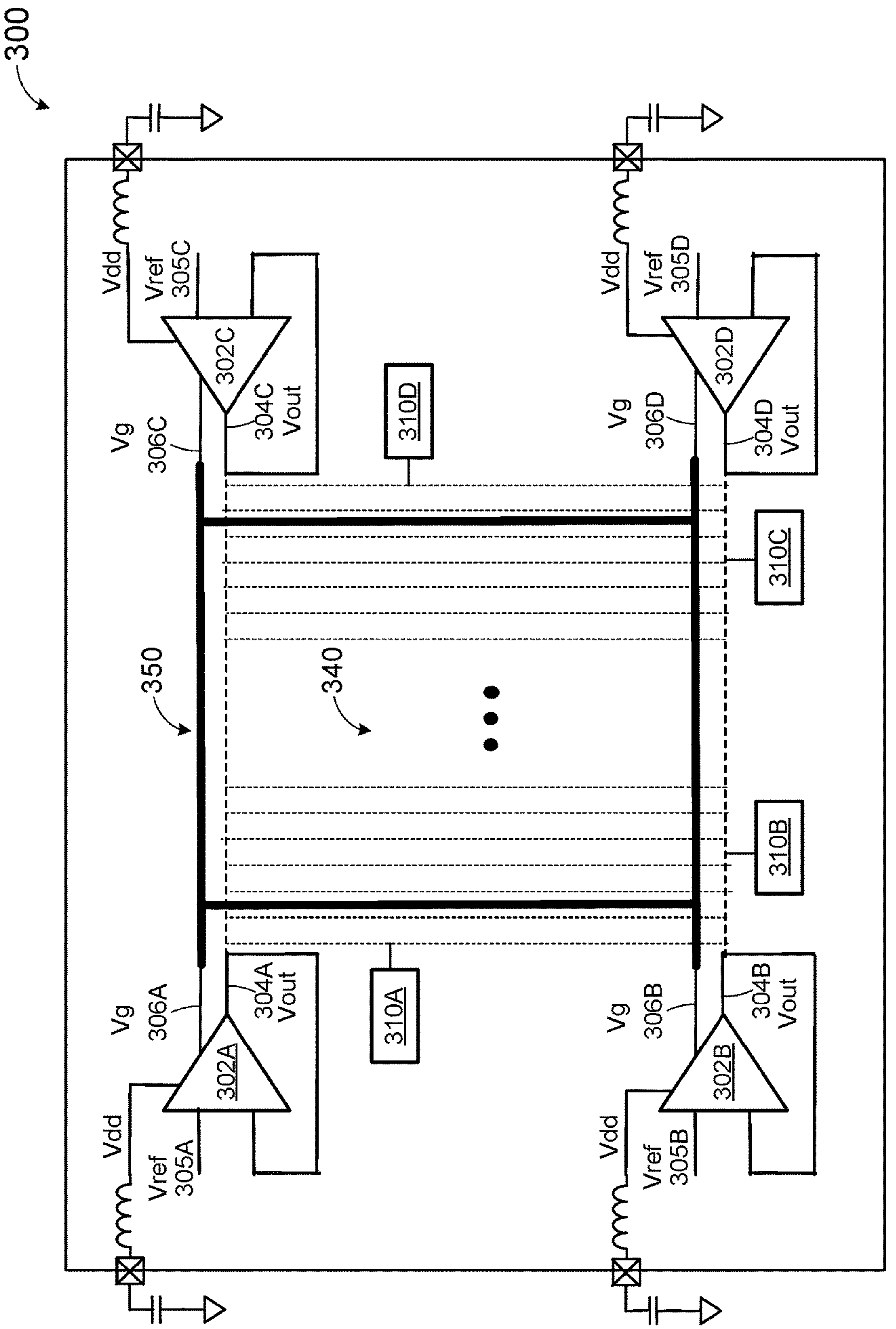
FIG. 3 is a simplified schematic diagram illustrating an integrated circuit having a distributed voltage regulator structure according to some embodiments of the present invention.

FIG. 3 is a simplified schematic diagram illustrating an integrated circuit having a distributed voltage regulator structure according to some embodiments of the present invention. The integrated circuit can have a plurality of voltage regulators for more uniform power distribution and heat dissipation on large chip. A given voltage regulator of the plurality of voltage regulators comprises a differential amplifier and an output transistor, the differential amplifier and the output transistor coupled at a gate node of the output transistor and providing a regulated output voltage at an output node of the output transistor. The integrated circuit also has a common power line, which is coupled to the output node of the output transistor in each of the plurality of voltage regulators, the common power line providing an operational power to one or more circuit blocks in the integrated circuit. Further, the integrated circuit has a common gate line, which is coupled to the gate node of the output transistor in each of the plurality of voltage regulators.

In the embodiment of FIG. 3, integrated circuit 300 is similar to integrated circuit 200 of FIG. 2. "One notable difference is that integrated circuit 300 in FIG. 3 includes a common gate line, which is coupled to the gate node of the output transistor in each of the plurality of voltage regulators."

As shown in FIG. 3, integrated circuit 300 includes a plurality of circuit blocks 310A, 310B, 310C, and 310D, . . . , etc. Integrated circuit 300 also includes a plurality of voltage regulators 302A, 302B, 302C, and 302D, . . . , etc., spatially distributed over the integrated circuit. Each one of voltage regulators 302A, 302B, 302C, and 302D, . . . etc., can be associated with one or more circuit blocks of the plurality of circuit blocks 310A, 310B, 310C, and 310D.

In some embodiments, voltage regulators 302A, 302B, 302C, and 302D can be low dropout regulators (LDOs). In other embodiments, voltage regulators 302A, 302B, 302C, and 302D can be other types of linear regulators, or other suitable regulators. Similar to LDO 100 in FIG. 1A and LDO 150 in FIG. 1B, each of the regulators in FIG. 3 can have a differential amplifier and an output transistor (not shown). The differential amplifier is configured to amplify a differential between a reference voltage and a regulated output voltage. An output of the differential amplifier is coupled to a gate node of the output transistor. The regulated output voltage is derived at an output node of the output transistor.

In some embodiments, voltage regulators 302A, 302B, 302C, and 302D can be configured to provide an identical output voltage Vout at different locations of the integrated circuit. For example, voltage regulators 302A, 302B, 302C, and 302D can be the same voltage regulators, each responding to a same reference voltage Vref. For example, voltage regulators 302A, 302B, 302C, and 302D can have reference voltages 305A, 305B, 305C, and 305D, respectively. In some embodiments, the reference voltages Vref can be provided by a band-gap reference circuit. A band-gap voltage generator (or bandgap voltage reference) is a temperature independent voltage reference circuit used in integrated circuits. It is configured to produce a fixed (constant) voltage regardless of power supply variations, temperature changes, and circuit loading from a device. It commonly has an output voltage around 1.25 V (close to the theoretical 1.22 eV bandgap of silicon at 0 K).

Integrated circuit 300 also has a common power line 340, shown in broken lines, which is coupled to the output node Vout of the output transistor in each of the plurality of voltage regulators. As shown in FIG. 3, common power line 340 is coupled to output node 304A for voltage regulator 302A, output node 304B for voltage regulator 302B, output node 304C for voltage regulator 302C, and output node 304D for voltage regulator 302D. The common power line 340 providing operational power to the plurality of circuit blocks in the integrated circuit. It can be seen in FIG. 3 that circuit blocks 310A-310D are coupled to common power line 340 to receive operational power.

As shown in FIG. 3, the output nodes 304A, 304B, 304C, and 304D are shorted together by the common power line 340. Common power line 340 can include multiple line segments distributed over the integrated circuit chip, and can be referred to as a power grid. The common power line can facilitate uniform distribution of operating power to circuit blocks disposed over the integrated circuit chip.

Integrated circuit 300 also has a common gate line 350 that is coupled to the gate node Vg of the output transistor in each of the plurality of voltage regulators. As shown in FIG. 3, common gate line 350 is coupled to gate node 306A for voltage regulator 302A, gate node 306B for voltage regulator 302B, gate node 302C for voltage regulator 302C, and gate node 306D for voltage regulator 302D.

The common power line 240 in FIG. 2 provides operational power to the plurality of circuit blocks in the integrated circuit. "Random resistor mismatches in the resistor divider and random MOSFET device mismatches in the error amplifier result in the actual output voltage being regulated at a certain offset below or above the targeted output voltage. It is possible to have a relatively large offset between these voltage regulators. The voltage regulator with the highest positive offset tries to regulate the power line 240 at a voltage higher than the voltage that the other voltage regulators with lower offsets try to regulate at." The negative voltage detected at the inputs of the differential amplifiers of the voltage regulators with lower offsets are amplified by the large loop gain and drive their output transistors to pass lower currents, or eventually completely disable their output transistors. It may be possible that one or two of these interconnected voltage regulators can source most or all the load current, while disabling other voltage regulators. This condition can cause non-uniform voltage and power distribution on the integrated circuits. It can also lead to worse power supply rejection and load dynamics.

"In some embodiments, the Vg nodes of all LDOs are shorted together and shielded with Vdd, ground, or other clean low impedance signals, depending on the LDO architectures, to minimize voltage disturbance on Vgs of the output transistor due to capacitive coupling from supply disturbance or other nearby noisy signals. For example, the Vg node needs to be shielded with Vdd for LDOs in FIG. 4 and FIG. 5, and ground for LDOs in FIG. 6 and FIG. 7. The inventors have observed that, since the gate voltage of the output transistor in each of the plurality of voltage regulators is tied to a common gate line, the effect of offsets that can exist between these voltage regulators can be mitigated. In this arrangement, offset currents from differential amplifiers of all voltage regulators are summed together at the shared common gate line, and all power transistors can have similar overdrive voltage. As a result, a similar driving current is provided from each voltage regulator, and similar PSRR (power supply rejection ratio) and load dynamics can be maintained at each voltage regulator. Further, because the gate node of the output transistor, which can be a power transistor, is often a high impedance node, or in most cases, a location of the dominant pole, the loop stability will not be noticeably affected by connecting the power transistor gates together for all voltage regulators."

The common power line and common gate line can be implemented as conduction lines on the integrated circuit chip using integrated circuit fabrication processes. The conduction lines can be metal interconnect lines or other conductive lines, such as doped poly silicon lines. The conduction lines can be formed as a layer of conductive material and then patterned according to the desired layout. Connections between the common power line and the output nodes of the regulators can be made through vias or other contact structures. Similarly, connections between the common gate line and the gate nodes of the regulators can be made through vias or other contact structures. In some embodiments, the shielding of the common gate line can be accomplished by surrounding the common gate line with conduction lines tied to Vdd, ground, or other clean low impedance signals.

Figure 4:
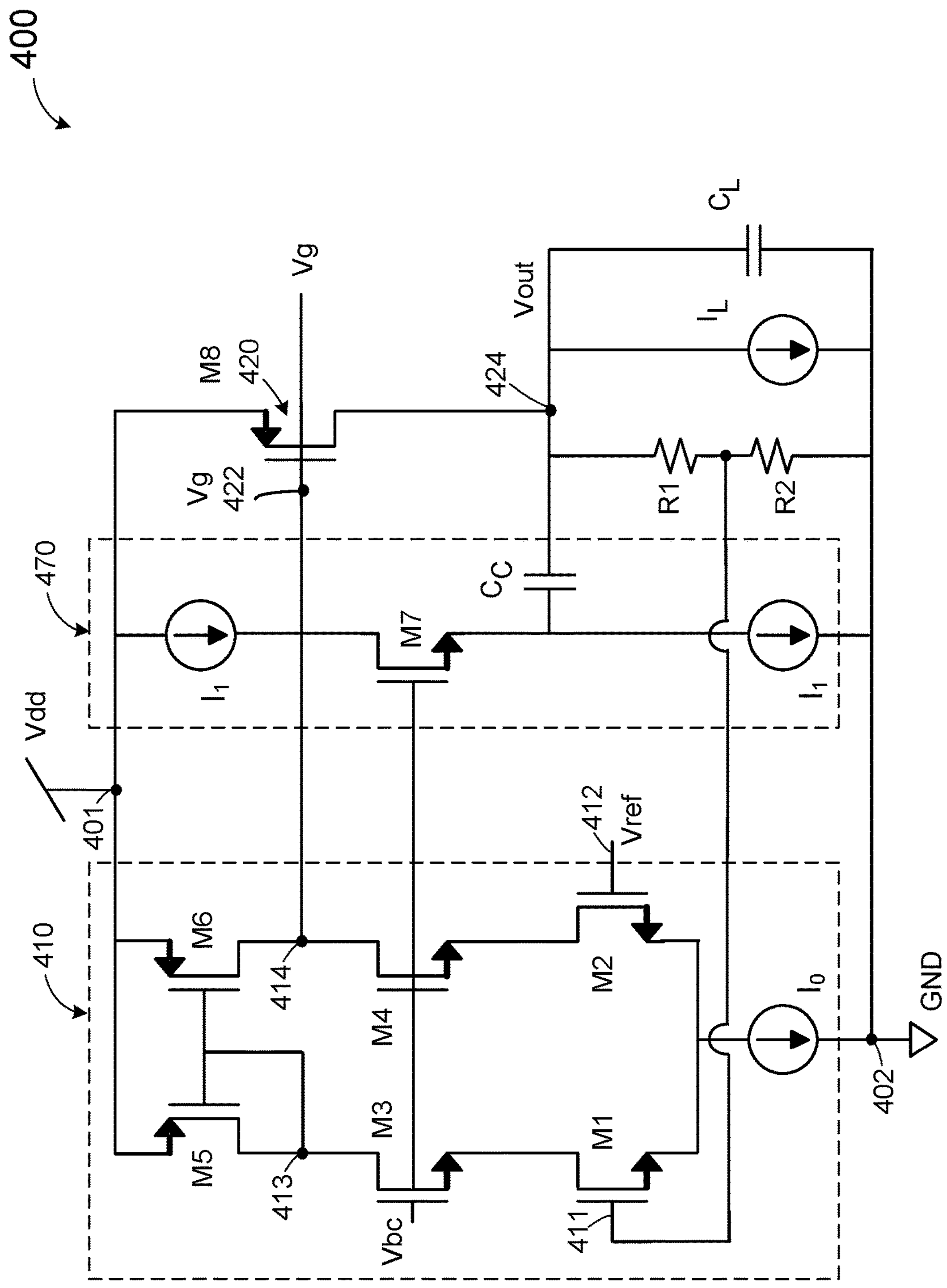
FIG. 4 is a simplified schematic diagram illustrating a low-dropout voltage regulator (LDO) according to some embodiments of the present invention.

FIG. 4 is a simplified schematic diagram illustrating a low-dropout voltage regulator (LDO) according to some embodiments of the present invention. "In FIG. 4, voltage regulator 400 is a low-dropout voltage regulator (LDO) that is an example of an LDO that can be used as LDO 100 in FIG. 1A, LDO 150 in FIG. 1B, voltage regulators, any of the plurality of voltage regulators 202A, 202B, 202C, and 202D, . . . , etc., in FIG. 2, or any of the plurality of voltage regulators 302A, 302B, 302C, and 302D, . . . , etc., in FIG. 3."

As shown in FIG. 4, LDO 400 has a first power supply terminal 401 coupled to a supply voltage Vdd and a second power terminal 402 coupled to a ground GND. LDO 400 has a differential amplifier 410 and an output transistor 420. "LDO 400 includes a pair of input transistors M1 and M2, a pair of bias transistors M3 and M4, and a pair of current mirror transistors M5 and M6 coupled between the power supply terminal 401 and the ground terminal 402. A bias voltage Vbc is coupled to a gate node of each of the pair of bias transistors M3, M4, and M7."

As shown in FIG. 4, LDO 400 also has a circuit 470 for Ahuja miller compensation for loop stability. "Circuit 470 includes transistor M7, a capacitor $C_C$, a current source, and a current sink providing a current $I_1$."Bias voltage Vbc is coupled to NMOS transistor in active region to increase the gain of the feedback loop, and to implement Ahuja miller compensation together with capacitor $C_C$, a current source, and a current sink providing a current I1 for loop stability.

Differential amplifier 410 includes a first input 411 at a gate node of a first transistor M1 for receiving a sample of the LDO output voltage Vout at output node 424 through a voltage divider made up of resistors R1 and R2. Differential amplifier 410 also includes a second input 412 at a gate node of a second transistor M2 for receiving a reference voltage, Vref, which can be provided, e. g., by a band-gap reference circuit (not shown). The first and second transistors M1 and M2 are coupled to the ground GND at power terminal 402 through a current sink that provides a current $I_0$. Differential amplifier 410 also includes a current mirror made up of two transistors M5 and M6. "Current mirror transistors M5 and M6 are coupled to Vdd at the power terminal 401. As shown in FIG. 4, differential amplifier 410 further includes a transistor M3 disposed between transistors M1 and M5, and a transistor M4 disposed between transistors M2 and M6." The gate nodes of transistors M5 and M6 are coupled together, and these gate nodes are coupled to a node 413 between transistors M3 and M5 to form the current mirror. An output node for differential amplifier 410 is provided at a node 414 between transistors M4 and M6.

In the example of FIG. 4, transistors M1, M2, M3, and M4 are N-channel transistors, or NMOS transistors. Transistors M5 and M6 are P-channel transistors. Therefore, node 413 is coupled to the drain node of P-channel transistor M5 and the drain node of N-channel transistor M3. Node 414 is coupled to the drain node of P-channel transistor M6 and the drain node of N-channel transistor M4.

In the example of FIG. 4, output transistor 420 is a P-channel MOS transistor M8 (420) having a source node coupled to power supply Vdd, a gate node 422 at a gate voltage Vg. The gate node 422 of transistor M8 (420) is coupled to the output node 414 of the differential amplifier 410. An output node 424 is a drain node for transistor 420, and is also the output node for LDO 400. A load for the LDO 400 is represented by a load capacitor $C_L$ and load current $I_L$.

Figure 5:
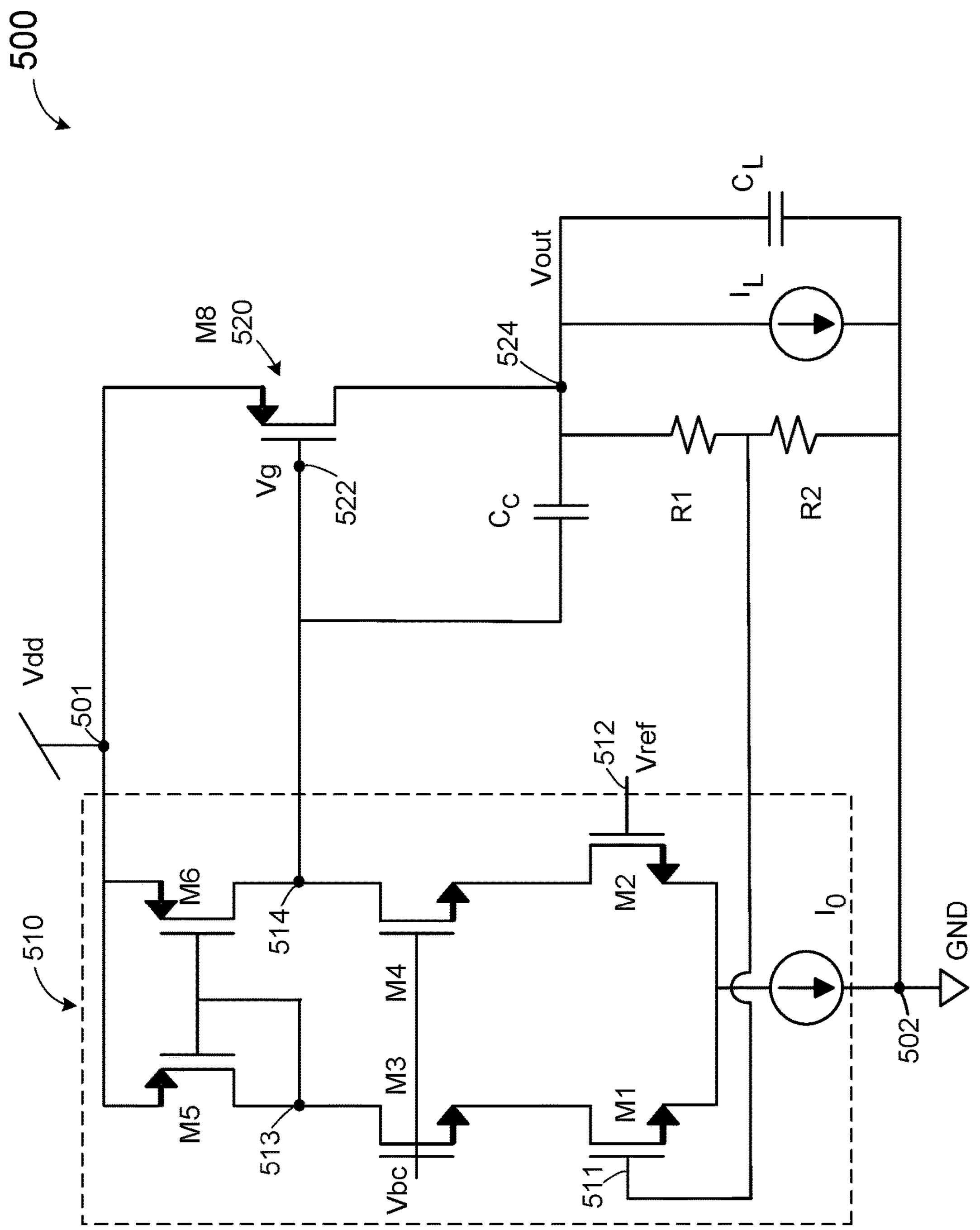
FIG. 5 is a simplified schematic diagram illustrating another low-dropout voltage regulator (LDO) according to some embodiments of the present invention.

"FIG. 5 is a simplified schematic diagram illustrating another low-dropout voltage regulator (LDO) according to some embodiments of the present invention." In FIG. 5, voltage regulator 500 is a low-dropout voltage regulator (LDO) that is an example of an LDO can be used as LDO in FIG. 1A, LDO 150 in FIG. 1B, voltage regulators, any of the plurality of voltage regulators 202A, 202B, 202C, and 202D, . . . , etc., in FIG. 2, or any of the plurality of voltage regulators 302A, 302B, 302C, and 302D, . . . , etc., in FIG. 3.

As shown in FIG. 5, LDO 500 has a first power supply terminal 501 coupled to a supply voltage Vdd and a second power terminal 502 coupled to a ground GND. LDO 500 has a differential amplifier 510 and an output transistor 520. Differential amplifier 510 includes a first input 511 at a gate node of a transistor M1 for receiving a sample of the LDO output voltage Vout at output node 524 through a voltage divider made up of resistors R1 and R2. Differential amplifier 510 also includes a second input 512 at a gate node of a transistor M2 for receiving a reference voltage, Vref, which can be provided by a band-gap reference circuit (not shown). Transistors M1 and M2 are coupled to the ground GND at power terminal 502 through a current sink that provides a current $I_0$. "Differential amplifier 510 also includes a current mirror made up of two transistors M5 and M6. Current mirror transistors M5 and M6 are coupled to Vdd at the power terminal 501. As shown in FIG. 5, differential amplifier 510 further includes a transistor M3 disposed between transistors M1 and M5, and a transistor M4 disposed between transistors M2 and M6." The gate nodes of transistors M5 and M6 are coupled together, and these gate nodes are coupled to a node 513 between transistors M3 and M5 to form the current mirror. An output node for differential amplifier 510 is provided at a node 514 between transistors M4 and M6.

In the example of FIG. 5, transistors M1, M2, M3, and M4 are N-channel transistors, or NMOS transistors. Transistors M5 and M6 are P-channel transistors. Therefore, node 513 is coupled to the drain node of P-channel transistor M5 and the drain node of N-channel transistor M3. Node 514 is coupled to the drain node of P-channel transistor M6 and the drain node of N-channel transistor M4.

"In the example of FIG. 5, output transistor 520 is a P-channel MOS transistor M8 (520) having a source node coupled to power supply Vdd, and a gate node 522 at a gate voltage Vg." The gate node 522 of transistor M8 (520) is coupled to the output node 514 of the differential amplifier 510. An output node 524 is a drain node for transistor 520, and is also the output node for LDO 500. A capacitance $C_C$ represents a Miller compensation capacitor. A load for the LDO 500 is represented by a load capacitor $C_L$ and load current $I_L$.

Figure 6:
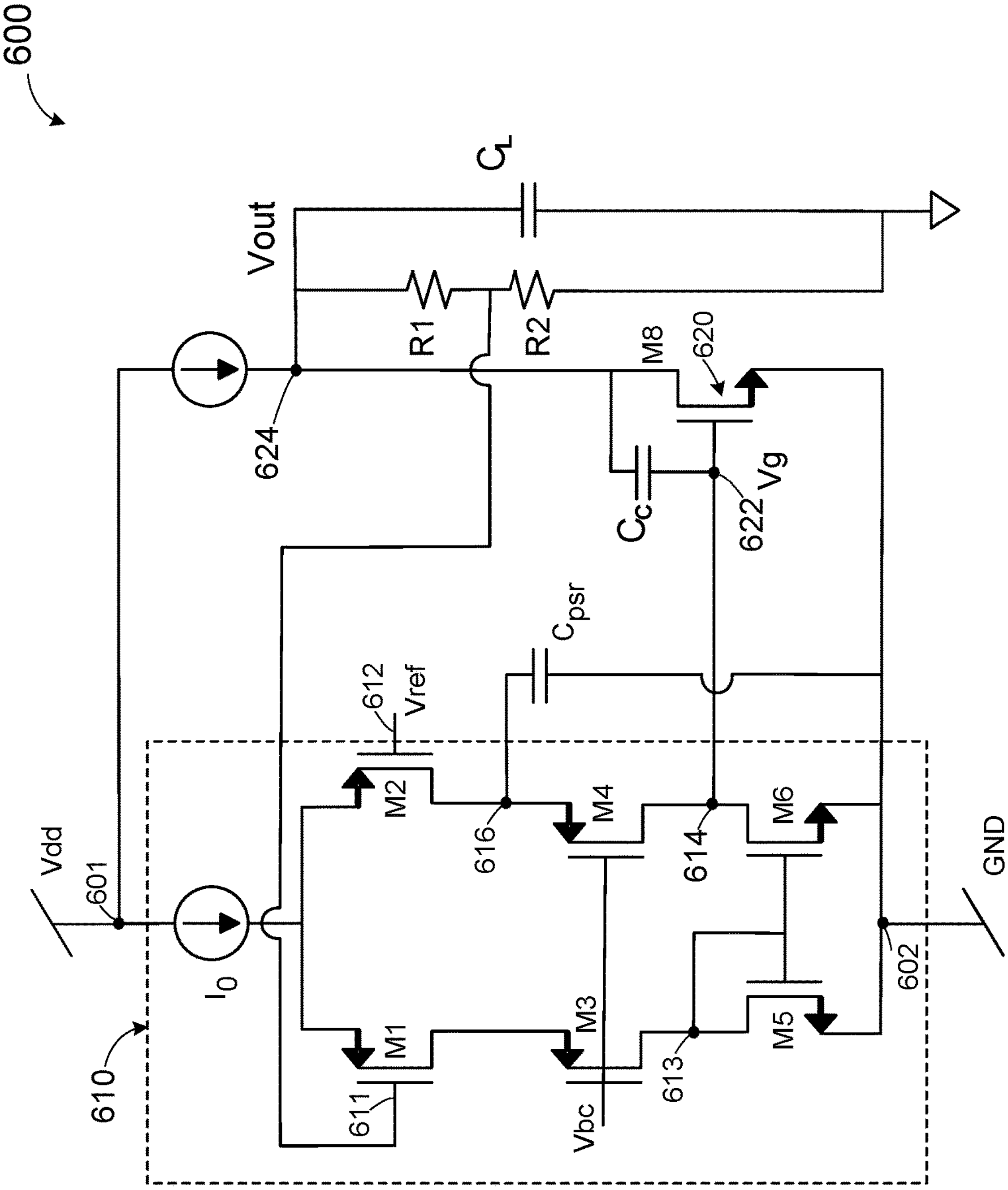
FIG. 6 is a simplified schematic diagram illustrating yet another low-dropout voltage regulator (LDO) according to some embodiments of the present invention.

FIG. 6 is a simplified schematic diagram illustrating yet another low-dropout voltage regulator (LDO) according to some embodiments of the present invention. "In FIG. 6, voltage regulator 600 is a low-dropout voltage regulator (LDO) that is an example of an LDO that can be used as LDO 100 in FIG. 1A, LDO 150 in FIG. 1B, voltage regulators, any of the plurality of voltage regulators 202A, 202B, 202C, and 202D, . . . , etc., in FIG. 2, or any of the plurality of voltage regulators 302A, 302B, 302C, and 302D, . . . , etc., in FIG. 3."

LDO 600 has a first power supply terminal 601 coupled to a supply voltage Vdd and a second power terminal 602 coupled to a ground GND. LDO 600 is similar to LDO 500 in FIG. 5. One difference is that LDO 600 has an N-channel transistor as the output transistor, and the circuit topology is an N-channel version of LDO 500 in FIG. 5.

As shown in FIG. 6, LDO 600 has a differential amplifier 610 and an output transistor 620. Differential amplifier 610 includes a first input 611 at a gate node of a transistor M1 for receiving a sample of the LDO output voltage Vout at output node 624 through a voltage divider made up of resistors R1 and R2. Differential amplifier 610 also includes a second input 612 at a gate node of a transistor M2 for receiving a reference voltage, Vref, which can be provided by a band-gap reference circuit (not shown). "Transistors M1 and M2 are coupled to a power supply Vdd at power terminal 601 through a current source that provides a current $I_0$. Differential amplifier 610 also includes a current mirror made up of two transistors M5 and M6. Current mirror transistors M5 and M6 are coupled to a ground node GND at the power terminal 602. As shown in FIG. 6, differential amplifier 610 further includes a transistor M3 disposed between transistors M1 and M5, and a transistor M4 disposed between transistors M2 and M6." The gate nodes of transistors M5 and M6 are coupled together, and these gate nodes are coupled to a node 613 between transistors M3 and M5 to form the current mirror. An output node for differential amplifier 610 is provided at a node 614 between transistors M4 and M6.

"In the example of FIG. 6, transistors M1, M2, M3, and M4 are P-channel transistors, or PMOS transistors." Transistors M5 and M6 are N-channel transistors. Therefore, node 613 is coupled to the drain node of N-channel transistor M5 and the drain node of P-channel transistor M3. Node 614 is coupled to the drain node of N-channel transistor M6 and the drain node of P-channel transistor M4.

In the example of FIG. 6, output transistor 620 is an N-channel MOS transistor M8 (620) having a source node coupled to ground GND, and a gate node 622 at a gate voltage Vg. The gate node 622 of transistor M8 (620) is coupled to the output node 614 of the differential amplifier 610. An output node 624 is a drain node for transistor 620, and is also the output node for LDO 600. Node 624 is coupled to the power supply Vdd through a current source providing a current $I_L$. A capacitance $C_C$ represents a Miller compensation capacitor. A load for the LDO 600 is represented by a load capacitor $C_L$.

Figure 7:
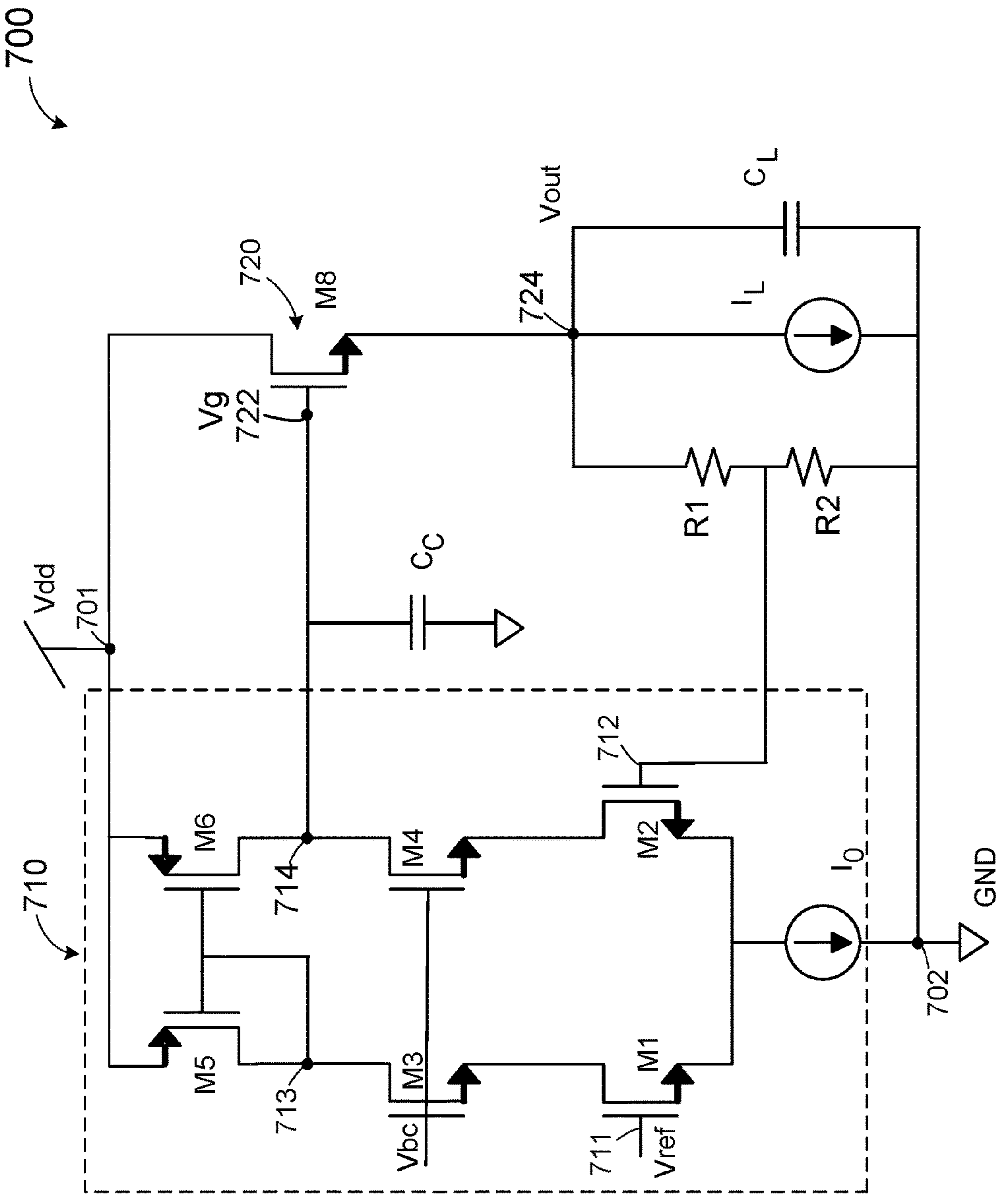
FIG. 7 is a simplified schematic diagram illustrating a voltage regulator according to some embodiments of the present invention.

FIG. 7 is a simplified schematic diagram illustrating a voltage regulator according to some embodiments of the present invention. "In FIG. 7, voltage regulator 700 is a voltage in a source follower topology with an N-channel transistor as the output transistor, which is an example of a linear regulator that can be used in place of the LDO 100 in FIG. 1A, LDO 150 in FIG. 1B, voltage regulators, any of the plurality of voltage regulators 202A, 202B, 202C, and 202D, . . . , etc., in FIG. 2, or any of the plurality of voltage regulators 302A, 302B, 302C, and 302D, . . . , etc., in FIG. 3."

As shown in FIG. 7, voltage regulator 700 has a first power supply terminal 701 coupled to a supply voltage Vdd and a second power terminal 702 coupled to a ground GND. Voltage regulator 700 has a differential amplifier 710 and an output transistor 720. Differential amplifier 710 includes a first input 712 at a gate node of a transistor M1 for receiving a sample of the LDO output voltage Vout at output node 724 through a voltage divider made up of resistors R1 and R2. Differential amplifier 710 also includes a second input 711 at a gate node of a transistor M2 for receiving a reference voltage, Vref, which can be provided by a band-gap reference circuit (not shown). Transistors M1 and M2 are coupled to the ground GND at power terminal 702 through a current sink that provides a current $I_0$. Differential amplifier 710 also includes a current mirror made up of two transistors M5 and M6. "Current mirror transistors M5 and M6 are coupled to Vdd at the power terminal 701. As shown in FIG. 7, differential amplifier 710 further includes a transistor M3 disposed between transistors M1 and M5, and a transistor M4 disposed between transistors M2 and M6." The gate nodes of transistors M5 and M6 are coupled together, and these gate nodes are coupled to a node 713 between transistors M3 and M5 to form the current mirror. An output node for differential amplifier 710 is provided at a node 714 between transistors M4 and M6.

In the example of FIG. 7, transistors M1, M2, M3, and M4 are N-channel transistors, or NMOS transistors. Transistors M5 and M6 are P-channel transistors, or PMOS transistors. Therefore, node 713 is coupled to the drain node of P-channel transistor M5 and the drain node of N-channel transistor M3. Node 714 is coupled to the drain node of P-channel transistor M6 and the drain node of N-channel transistor M4.

In some embodiments, the integrated circuit descried above can include voltage regulators described in co-pending patent application, U.S. patent application Ser. No. 16/699,080, entitled "VOLTAGE REGULATOR CIRCUIT WITH HIGH POWER SUPPLY REJECTION RATIO." filed on the same day, the content of which is incorporated by reference herein.

"For example, the voltage regulator in the integrated circuit described above can include a power supply terminal and a ground terminal, and a differential amplifier coupled between the power supply terminal and the ground terminal. The voltage regulator can also include an output transistor, including a gate node coupled to an output node of the differential amplifier to receive a gate voltage and to provide a regulated output voltage at an output node of the output transistor, wherein the differential amplifier is configured to provide the gate voltage based on a differential between a reference voltage and the regulated output voltage. The voltage regulator can also include a compensation capacitance coupled between a virtual ground node and either the power supply terminal or the ground terminal, the compensation capacitance providing a current path to the gate node of the output transistor."

In some embodiments of the above voltage regulator, the compensation capacitance is coupled between a power supply terminal and the virtual ground node. "In some embodiments, the output transistor is a P-channel transistor, and the output node is a drain node of the output transistor." In some embodiments, the output transistor is an N-channel transistor, and the output node is a source node of the output transistor. In some embodiments, the output transistor is an N-channel transistor, and the output node is a drain node of the N-channel transistor. In some embodiments, the compensation capacitance is coupled between a ground terminal and the virtual ground node.

In the example of FIG. 7, output transistor 720 is an N-channel MOS transistor M8 (720) having a drain node coupled to power supply Vdd, a gate node 722 at a gate voltage Vg. The gate node 722 of transistor M8 (720) is coupled to the output node 714 of the differential amplifier 710. An output node 724 is a source node for transistor 720, and is also the output node for voltage regulator 700 in the source follower configuration. A capacitance $C_C$ represents a Miller compensation capacitor. A load for Voltage regulator 700 is represented by a load capacitor $C_L$ and load current $I_L$.

Figure 8:
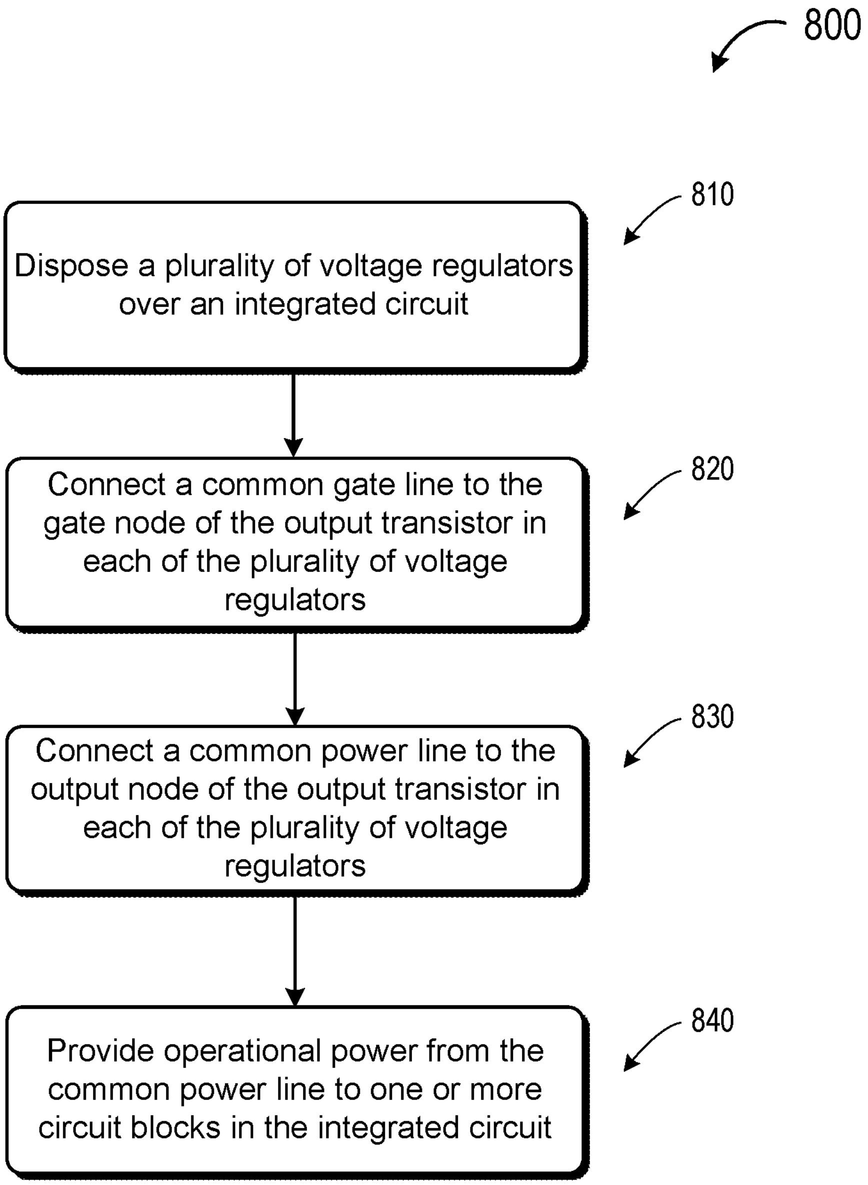
FIG. 8 is a simplified flowchart illustrating a method for a distributed voltage regulators structure according to some embodiments of the present invention.

FIG. 8 is a simplified flowchart illustrating a method for a distributed voltage regulators structure according to some embodiments of the present invention. As shown in the flowchart of FIG. 8, a method 800 can be summarized as follows:

Process 810—Dispose a plurality of voltage regulators over an integrated circuit;

Process 820—Connect a common gate line to the gate node of the output transistor in each of the plurality of voltage regulators;

Process 830—Connect a common power line to the output node of the output transistor in each of the plurality of voltage regulators; and Process 840—Provide operational power from the common power line to one or more circuit blocks in the integrated circuit.

At 810, the method includes disposing a plurality of voltage regulators over an integrated circuit. An example is described above in connection with FIG. 3. A given voltage regulator of the plurality of voltage regulators can include a differential amplifier and an output transistor. The differential amplifier and the output transistor are coupled at a gate node of the output transistor. The voltage regulator provides a regulated output voltage at an output node of the output transistor.

At 820, the method includes connecting a common gate line to the gate node of the output transistor in each of the plurality of voltage regulators. "An example is described above in connection with FIG. 3."

At 830, the method includes connecting a common power line to the output node of the output transistor in each of the plurality of voltage regulators. "The common power line provides an operational power to one or more circuit blocks in the integrated circuit."

At 840, the method include providing operational power from the common power line to circuit blocks in the integrated circuit.

Numerous specific details are set forth herein to provide a thorough understanding of the claimed subject matter. However, those skilled in the art will understand that the claimed subject matter may be practiced without these specific details. "In other instances, methods, apparatuses, or systems that would be known by one of ordinary skill have not been described in detail so as not to obscure the claimed subject matter."

"While the present subject matter has been described in detail with respect to specific embodiments thereof, it will be appreciated that those skilled in the art, upon attaining an understanding of the foregoing, may readily produce alterations to, variations of, and equivalents to such embodiments." Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in any order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. An integrated circuit, comprising:

a plurality of circuit blocks;

a plurality of voltage regulators spatially distributed over the integrated circuit, each voltage regulator associated with a respective circuit block of the plurality of circuit blocks, wherein each voltage regulator of the plurality of voltage regulators comprises:

a power supply terminal, a ground terminal, a reference voltage terminal, a gate terminal, and an output terminal;

a differential amplifier coupled between the power supply terminal and the ground terminal and configured to generate a gate voltage at the gate terminal by amplifying a differential between a reference voltage at the reference voltage terminal and a regulated output voltage at the output terminal based on a bias voltage;

an output transistor having a gate node coupled with the gate terminal and an output node coupled with the output terminal, the output transistor configured to generate the regulated output voltage at the output terminal based on the gate voltage at the gate terminal;

a compensation capacitance coupled between the gate terminal and the output terminal; and a loop stability transistor having a gate coupled with the bias voltage, a drain coupled with a current source, and a source coupled with a current sink and with the compensation capacitance;

a common gate line coupled to the gate terminal of each of the plurality of voltage regulators, the common gate line shielded with the power supply terminal or the ground terminal; and a common power line coupled to the output terminal of each of the plurality of voltage regulators, the common power line providing operational power to the plurality of circuit blocks in the integrated circuit.

2. The integrated circuit of claim 1, wherein each of the plurality of voltage regulators comprises a low dropout (LDO) voltage regulator.

3. The integrated circuit of claim 1, wherein the output transistor of each voltage regulator comprises a P-channel MOS transistor, and the output node of the output transistor is at a drain node of the P-channel MOS transistor.

4. The integrated circuit of claim 1, wherein the output transistor of each voltage regulator comprises an N-channel MOS transistor, and the output node of the output transistor is at a drain node of the N-channel MOS transistor.

5. The integrated circuit of claim 1, wherein the output transistor of each voltage regulator comprises an N-channel MOS transistor, and the output node is at a source node of the N-channel MOS transistor.

6. The integrated circuit of claim 1, wherein:

the output transistor in each voltage regulator circuit is a P-channel transistor, and the output node is a drain node of the output transistor.

7. The integrated circuit of claim 1, wherein:

the output transistor in each voltage regulator circuit is an N-channel transistor, and the output node is a source node of the output transistor.

8. The integrated circuit of claim 1, wherein the output transistor in each voltage regulator circuit is an N-channel transistor, and the output node is a drain node of the N-channel transistor.

9. The integrated circuit of claim 1, wherein the common gate line is shielded by the power supply terminal or the ground terminal by surrounding the common gate line with conduction lines tied to the power supply terminal or the ground terminal.

10. An integrated circuit, comprising:

a plurality of voltage regulators, wherein each of the plurality of voltage regulators comprises:

a power supply terminal, a ground terminal, a reference voltage terminal, a gate terminal, and an output terminal;

a differential amplifier and an output transistor, the differential amplifier coupled between the power supply terminal and the ground terminal, an output of the differential amplifier and a gate node of the output transistor coupled with the gate terminal, a first input of the differential amplifier coupled with the reference voltage terminal, and a second input of the differential amplifier and an output node of the output transistor coupled with the output terminal, the differential amplifier configured to generate a gate voltage at the gate terminal by amplifying a differential between voltages at the reference voltage terminal and the output terminal based on a bias voltage, the output transistor configured to generate a regulated output voltage at the output terminal based on the gate voltage at the gate terminal;

a compensation capacitance coupled between the gate terminal and the output terminal; and a loop stability transistor having a gate coupled with the bias voltage, a drain coupled with a current source, and a source coupled with a current sink and with the compensation capacitance;

a common gate line-coupled to the gate terminal of each of the plurality of voltage regulators, the common gate line shielded with the power supply terminal or the ground terminal; and a common power line coupled to the output terminal of each of the plurality of voltage regulators, the common power line providing operational power to the plurality of circuit blocks in the integrated circuit.

11. The integrated circuit of claim 10, wherein each of the plurality of voltage regulators comprises a linear regulator.

12. The integrated circuit of claim 10, wherein each of the plurality of voltage regulators comprises a low dropout (LDO) regulator.

13. The integrated circuit of claim 10, wherein the output transistor of each voltage regulator is a power transistor.

14. The integrated circuit of claim 10, wherein the output transistor of each voltage regulator comprises a P-channel MOS transistor, and the output node is at a drain node of the P-channel MOS transistor.

15. The integrated circuit of claim 10, wherein the output transistor of each voltage regulator comprises an N-channel MOS transistor, and the output node is at a drain node of the N-channel MOS transistor.

16. The integrated circuit of claim 10, wherein the output transistor of each voltage regulator comprises an N-channel MOS transistor, and the output node is at a source node of the N-channel MOS transistor.

17. The integrated circuit of claim 10, wherein the gate node of the output transistor in each voltage regulator determines a dominant pole of the voltage regulator.

18. The integrated circuit of claim 10, wherein the plurality of voltage regulators are distributed symmetrically over the integrated circuit.

* * * * *